United States Patent
Furuta et al.

(10) Patent No.: US 8,045,359 B2
(45) Date of Patent: Oct. 25, 2011

(54) SWITCHING ELEMENT, METHOD OF MANUFACTURING THE SWITCHING ELEMENT, AND MEMORY ELEMENT ARRAY

(75) Inventors: Shigeo Furuta, Tsukuba (JP); Tsuyoshi Takahashi, Tsukuba (JP); Masatoshi Ono, Tsukuba (JP)

(73) Assignees: Funai Electric Advanced Applied Technology Research Institute Inc., Tsukuba-shi (JP); Funai Electric Co., Ltd., Daito-shi (JP)

( * ) Notice: Subject to any disclaimer, the term of this patent is extended or adjusted under 35 U.S.C. 154(b) by 642 days.

(21) Appl. No.: 12/195,165

(22) Filed: Aug. 20, 2008

(65) Prior Publication Data
US 2009/0052223 A1 Feb. 26, 2009

(30) Foreign Application Priority Data
Aug. 22, 2007 (JP) ................................ 2007-215864

(51) Int. Cl.
*G11C 11/00* (2006.01)
(52) U.S. Cl. ......... 365/148; 365/100; 365/129; 977/943
(58) Field of Classification Search ............... 365/94, 365/100, 129, 148; 327/493; 257/30; 977/943, 977/933–935
See application file for complete search history.

(56) References Cited

U.S. PATENT DOCUMENTS

| 5,786,613 | A | 7/1998 | Kalnitsky |
| 2003/0180989 | A1* | 9/2003 | Chen et al. ................. 438/142 |
| 2008/0315184 | A1* | 12/2008 | Furuta et al. ................. 257/30 |

FOREIGN PATENT DOCUMENTS

| JP | 7-273355 A | 10/1995 |
| JP | 7-321292 A | 12/1995 |
| JP | 8-242008 A | 9/1996 |
| JP | 10-22403 A | 1/1998 |
| JP | 2005-79335 A | 3/2005 |
| JP | 2007-123828 A | 5/2007 |

OTHER PUBLICATIONS

Chinese Office Action dated Aug. 8, 2011 with English translation (eleven (11) pages).

* cited by examiner

*Primary Examiner* — Richard Elms
*Assistant Examiner* — Harry W Byrne
(74) *Attorney, Agent, or Firm* — Crowell & Moring LLP

(57) ABSTRACT

Disclosed is a switching element including: an insulative substrate; a first electrode and a second electrode provided to the insulative substrate; an interelectrode gap between the first electrode and the second electrode, comprising a gap of a nanometer order which causes switching phenomenon of resistance by applying a predetermined voltage between the first electrode and the second electrode; and a sealing member to seal the interelectrode gap such that the gap is retained.

7 Claims, 3 Drawing Sheets

SWITCHING ELEMENT, METHOD OF MANUFACTURING THE SWITCHING ELEMENT, AND MEMORY ELEMENT ARRAY

BACKGROUND OF THE INVENTION

1. Field of the Invention

The present invention relates to a switching element, a method of manufacturing the switching element, and a memory element array.

2. Description of Related Art

As devices are reduced in size and densities are enhanced, it is now required to further miniaturize electric element. As one example, there is known a switching element capable of carrying out a switching operation by applying voltage between two electrodes (interelectrode nanogap) which are separated from each other by a fine gap (see Japanese patent application Laid-open Nos. 07-321292, 10-22403, 08-242008 and 07-273355).

More specifically, there is developed a switching element which is made of silicon oxide and gold, which are stable materials, by a simple producing method called shadow evaporation (inclined deposition). According to this switching element, switching operation can stably be repeated (see Japanese Patent Application Laid-open Nos. 2005-79335 and 2007-123828 for example).

In order to make the switching elements disclosed in the above two documents be operative under any atmosphere (e.g. air atmosphere), the entire switching elements can be covered with a sealing member. Thus, in order to make a memory element array where the switching elements (memory elements) of the two documents are aligned in array be operative under any atmosphere, the entire memory element array is covered with a sealing member.

However, when an entire memory element array is covered with a sealing member, it has been problematic that if the sealing member brakes, all switching elements disposed in the memory elements array break down.

SUMMARY OF THE INVENTION

It is one of objects of the present invention to provide a switching element which can be used with high efficiency, a manufacturing method of the switching element, and a memory element array where the switching elements arranged therein can be used with high efficiency.

In order to achieve the above objects, according to a first aspect of the present invention, there is provided a switching element comprising: an insulative substrate; a first electrode and a second electrode provided to the insulative substrate; an interelectrode gap between the first electrode and the second electrode, comprising a gap of a nanometer order which causes switching phenomenon of resistance by applying a predetermined voltage between the first electrode and the second electrode; and a sealing member to seal the interelectrode gap such that the gap is retained.

According to a second aspect of the invention, there is provided a switching element comprising: an insulative substrate; a first electrode provided in contact with an upper surface of the insulative substrate; an insulative body provided to cover the first electrode, including a hole to expose a part of an upper surface of the first electrode; a second electrode provided in contact with an upper surface of the insulative body, located above the first electrode; an interelectrode gap between the first electrode and the second electrode in the hole, comprising a gap of a nanometer order which causes switching phenomenon of resistance by applying a predetermined voltage between the first electrode and the second electrode; and a sealing member to cover the second electrode and a opening of the hole, so as to seal the interelectrode gap such that the gap is retained, the sealing member being made of insulative material.

According to a third aspect of the present invention, there is provided a method of manufacturing the switching element according to claim 1, comprising: an interelectrode gap forming step to form the first electrode and the second electrode to the insulative substrate, so as to form the interelectrode gap; and a sealing step, subsequent to the interelectrode gap forming step, to seal the interelectrode gap with the sealing member such that the gap of the interelectrode gap is retained.

According to a fourth aspect of the present invention, there is provided a memory element array comprising a plurality of the switching elements according to any one of claims 1 to 5 arranged in array as memory elements, wherein the interelectrode gaps of the switching elements are sealed with the sealing member separately and independently to each other.

BRIEF DESCRIPTION OF THE DRAWINGS

The present invention will become more fully understood from the detailed description given hereinbelow and the appended drawings which given by way of illustration only, and thus are not intended as a definition of the limits of the present invention, and wherein.

DETAILED DESCRIPTION OF PREFERRED EMBODIMENTS

Hereinafter, a best mode for carrying out the invention is described in detail with reference to the drawings. However, it is not intended the scope of the invention is limited to the drawings.

Figure 1:
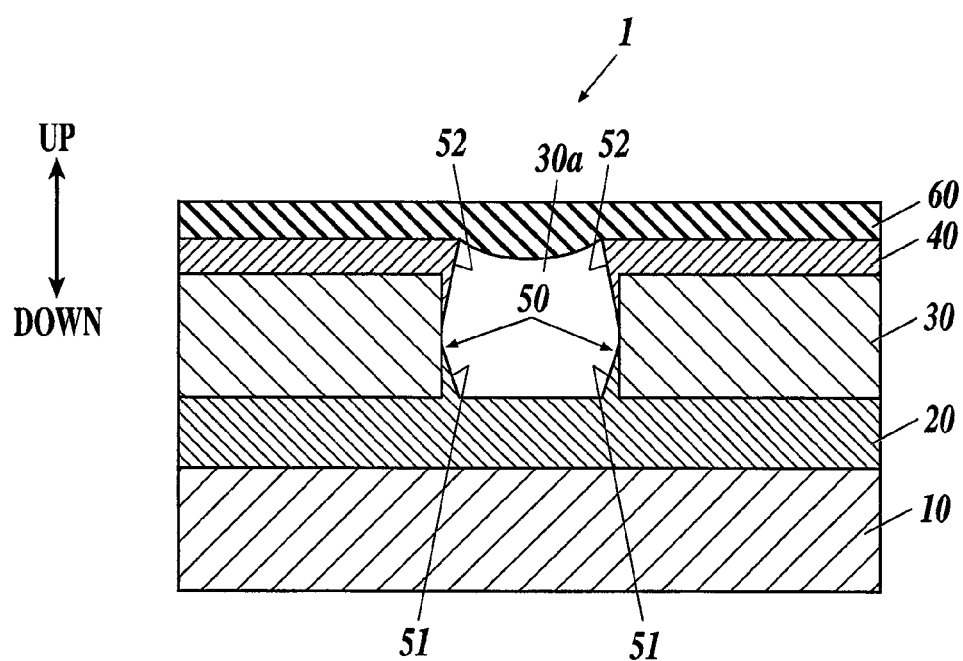
FIG. 1 shows a main part of the switching element of the present embodiment.
Figure 2:
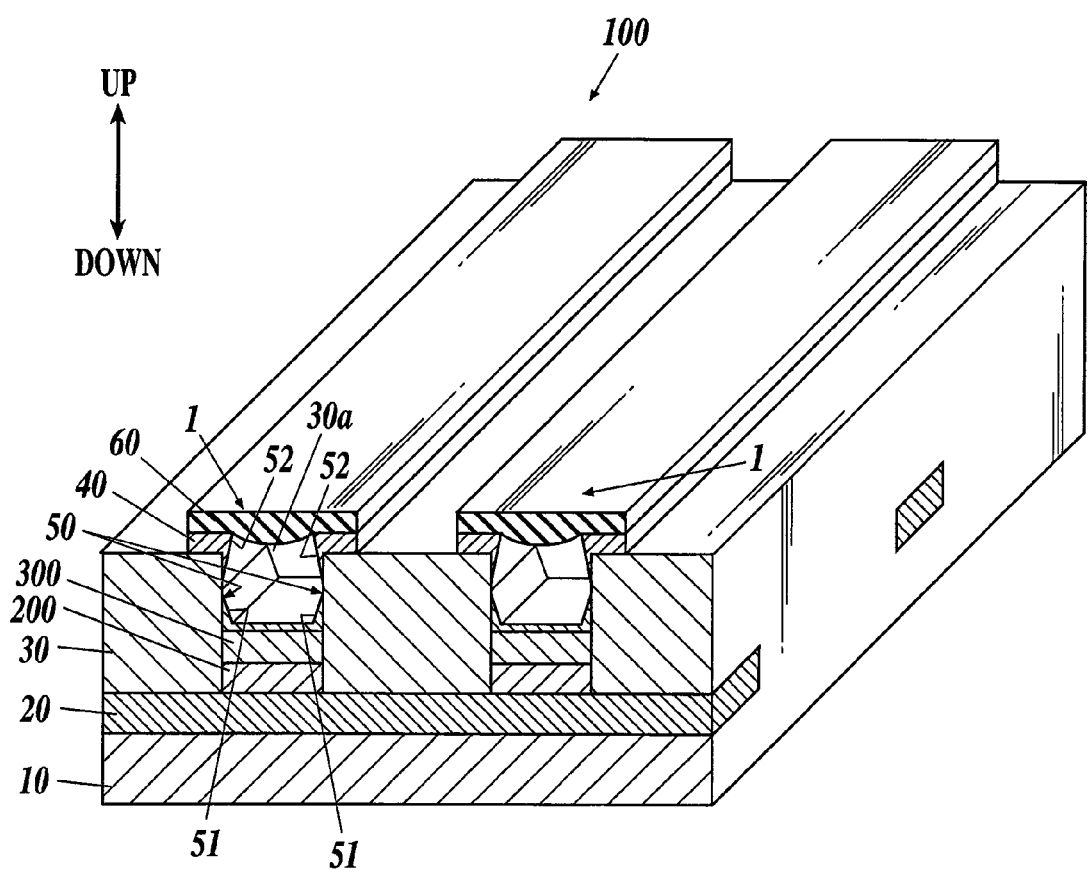
FIG. 2 shows a main part of the memory element array of the present embodiment.

FIG. 1 is a sectional view of a main part of a switching element 1 which is one example of embodiments of the present invention. FIG. 2 is a perspective sectional view of a main part of a memory element array 100 which is one example of embodiments of the present invention.

[Configuration of Switching Element]

The switching element 1 of the embodiment comprises, for example as shown in FIG. 1, an insulative substrate 10, a first electrode 20 provided in contact with an upper surface of the insulative substrate 10, an insulative body 30 provided in contact with an upper surface of the first electrode 20, a second electrode 40 provided in contact with the insulative body 30 which locates above the first electrode 20, an interelectrode gap 50 provided between the first electrode 20 and the second electrode 40, sealing member 60 provided in contact with an upper surface of the second electrode 40, and the like.

Specifically, for example, the insulative body 30 is provided to cover the first electrode, and has a hole 30a to expose a part of the upper surface of the first electrode 20.

On an inner wall of the hole 30a, there are provided a lower-gap member 51 where one end thereof contacts the first electrode 20 and the other end extends upward, and an upper-gap member 52 where one end thereof contact the second electrode 40 and the other end extends downward. The lower-gap member 51 and upper-gap member 52 define the interelectrode gap 50, and there are a gap in a nanometer order between the other end of the lower-gap member 51 and the other end of the upper-gap member 52.

The sealing member 60 covers, for example, the upper surface of the second electrode 50 and an opening of the hole 30a.

The insulative substrate 10 functions, for example, as a support to dispose the electrode (the first electrode 20) of the switching element 1.

The insulative substrate 10 is not limited in its structure and material. For specific example, surface shape of the insulative substrate 10 may be flat or concavoconvex. Further, the insulative substrate 10 may be made of a semiconductor substrate such as Si with an oxide film on its surface, or the substrate itself may be insulative. Preferable material of the insulative substrate 10 includes, for example, oxides such as glass and silicon oxide ($SiO_2$) and nitrides such as silicon nitride (SiN). Among them, silicon oxide ($SiO_2$) is preferable in the points of superior adhesion with the first electrode 20 and flexibility of its manufacture.

A predetermined voltage is applied to the first electrode 20 to let the switching element 1 perform switching operation in a pair with the second electrode 40.

The first electrode 20 is not limited in its shape, and may be modified into any shape.

Further, material of the first electrode 20 is not limited, and preferably at least one selected from a group consisting of, for example, gold, silver, platinum, palladium, nickel, aluminum, cobalt, chrome, rhodium, copper, tungsten, tantalum, carbon and the alloy thereof.

The first electrode 20 may be a laminate of two or more layers of different metals to enhance adhesion with the insulative substrate 10 and insulative body 30. Specifically, the first electrode 20 has a laminated (multi-layered) structure of chrome and gold.

The insulative body 30 functions, for example, as a support to position the two electrodes of the switching element 1 (the first electrode 20 and second electrode 40) to be separated from each other.

The insulative body 30 is not limited in its structure and material. For specific example, surface shape of the insulative body 30 may be flat or concavoconvex. Further, material of the insulative body 30 is preferably, for example, oxides such as glass and silicon oxide ($SiO_2$) and nitrides such as silicon nitride (SiN). Among them, silicon oxide ($SiO_2$) is preferable in the points of superior adhesion with the first electrode 20 and second electrode 40 and flexibility of its manufacture.

A predetermined voltage is applied to the second electrode 40 to let switching element 1 perform switching operation in a pair with the first electrode 20.

The second electrode 40 is not limited in its shape, and may be modified into any shape.

Further, material of the second electrode 40 is not limited, and preferably at least one selected from a group consisting of, for example, gold, silver, platinum, palladium, nickel, aluminum, cobalt, chrome, rhodium, copper, tungsten, tantalum, carbon and the alloy thereof.

The second electrode 40 may be a laminate of two or more layers of different metals to enhance adhesion with the insulative body 30. Specifically, the second electrode 40 has a laminated (multi-layered) structure of chrome and gold.

The interelectrode gap 50 is a gap in a nanometer order formed between the lower-gap member 51 and the upper-gap member 52, which causes switching phenomenon of resistance by applying a predetermined voltage between the first electrode 20 and the second electrode 40. The interelectrode gap 50 assumes switching phenomenon of the switching element 1.

As shown in FIG. 1 for example, the lower-gap member 51 protrudes from a side of the first electrode 20 toward the second electrode 40 in the inner wall of the hole 30a, and the upper-gap member 52 protrudes from a side of the second electrode 40 toward the first electrode 20 in the inner wall of the hole 30a.

The lower-gap member 51 is not limited in its shape, and may be modified into any shape. The lower-gap member 51 and the first electrode 20 may be integrally formed as shown in FIG. 1 for example, or may be formed as different members as shown in FIG. 2 for example.

Further, material of the lower-gap member 51 is not limited, and preferably at least one selected from a group consisting of, for example, gold, silver, platinum, palladium, nickel, aluminum, cobalt, chrome, rhodium, copper, tungsten, tantalum, carbon and the alloy thereof. The lower-gap member 51 may be a laminate of two or more layers of different metals to enhance adhesion with the insulative body 30. Specifically, the lower-gap member 51 has a laminated (multi-layered) structure of chrome and gold.

The upper-gap member 52 is not limited in its shape, and may be modified into any shape. The lower-gap member 52 and the second electrode 40 may be formed as different members or may be integrally formed as shown in FIG. 1 and FIG. 2 for example.

Further, material of the upper-gap member 52 is not limited, and preferably at least one selected from a group consisting of, for example, gold, silver, platinum, palladium, nickel, aluminum, cobalt, chrome, rhodium, copper, tungsten, tantalum, carbon and the alloy thereof. The upper-gap member 52 may be a laminate of two or more layers of different metals to enhance adhesion with the insulative body 30. Specifically, the upper-gap member 52 has a laminated (multi-layered) structure of chrome and gold.

The width of the interelectrode gap 50, i.e. the distance (clearance) G between the lower-gap member 51 and the upper-gap member 52 (between nanogap electrodes), is preferably within a range of 0 nm<G≦13 nm, and more preferably 0.8 nm<G<2.2 nm.

The upper limit of the distance G is defined to 13 nm because switching phenomenon does not occur in a gap clearance over 13 nm when the switching element is formed by shadow evaporation (inclined deposition), for example.

Further, the lower limit of the distance G is defined because a clearance of 0 nm means shortage of the lower-gap member 51 and the upper-gap member 52. Specifically, although the lower limit is difficult to determine by microscopic measurement, it is a minimum distance to cause tunnel current. That is, the lower limit is a minimum theoretical distance at which current-voltage profile does not obey Ohm's law and quantum tunnel effect is caused.

When resistance value is assigned to a theoretical equation of tunnel current, the gap clearance is calculated to be a range of 0.8 nm<G<2.2 nm as a result.

It is preferable direct current resistance of the interelectrode gap 50 (between the lower-gap member 51 and the upper-gap member 52) is, for example, more than 1 kΩ to less than 10 TΩ, and more preferably, more than 10 kΩ.

The upper limit of the resistance is defined to 10 TΩ because switching phenomenon does not occur at 10 TΩ or more.

Further, the lower limit of the resistance is defined to 1 kΩ because the resistance cannot be 1 kΩ or less.

Conceived as a switch, since higher resistance is preferable at an off state, higher upper limit is preferable. If the resistance at an on state is 1 kΩ or less, current flows easily in a mA order which may break peripheral elements. Thus, it is preferable the lower limit is around 10 kΩ.

One or a plurality of proximal portions (gap of the interelectrode gap 50) between the lower-gap member 51 and the upper-gap member 52 may be formed, for example, in an area where the lower-gap member 51 and the upper-gap member 52 oppose to each other.

An island (or cay) made of the same material or the like as that of the lower-gap member 51 and the upper-gap member 52 may be formed between the lower-gap member 51 and the upper-gap member 52. In this case, predetermined gaps (the gap of the interelectrode gap 50) are formed between the lower-gap member 51 and the island and between the upper-gap member 52 and the island so that the lower-gap member 51 and the upper-gap member 52 are not shorted.

The sealing member 60 has a function to seal the interelectrode gap 50 to shut the interelectrode gap 50 from the air in a manner that the gap is retained, so that the switching element 1 operates stably.

The sealing member 60 is not limited in its shape as long as it can seal the interelectrode gap 50, and may be modified into any shape.

The sealing member 60 is not limited in its material as long as it can seal the interelectrode gap 50 in a manner that the gap is retained. Specifically for example, the sealing member 60 is formed by application by spin coating or fusion adhesion. Thus, the preferable material is selected so that the sealing member 60 is kept away from braking into the hole 30a by its surface tension. Further, the preferable material is insulative one such as a resin or glass, but semiconductive or conductive material is also possible. The sealing material 60 may have a single-layered structure made of a single material or a laminated (multi-layered) structure made of a plurality kinds of materials.

The interior of the hole 30a sealed with the sealing member 60 may be under vacuum atmosphere or filled with various substances. The pressure P inside the hole 30a sealed with the sealing member 60 is, for example, preferably $10^{-6}$ Pa<P<2× $10^5$ Pa, and more preferably $10^2$ Pa<P<$10^5$ Pa.

Regarding the upper limit of the pressure P, it has been confirmed the switching element is operative under the pressure up to $10^5$ Pa, but the handling becomes difficult at the higher pressure. Thus, in consideration of a chance of air leak, the upper limit is defined to 2×$10^5$ Pa which is a little higher.

Regarding the lower limit of the pressure P, it has been confirmed the switching element is operative under the pressure as low as $10^{-6}$ Pa, but the handling becomes difficult at the lower pressure. Thus, it is preferable the lower limit is $10^2$ Pa which can be obtained by a simple industrial vacuum system.

Further, the interior of the hole 30a sealed with the sealing member 60 may be filled with inert gas such as dry air, nitrogen or rare gas like Ar, or electrically inert organic solvent such as toluene.

[Method of Manufacturing the Switching Element]

Next, a method of manufacturing the switching element 1 is described.

The switching element 1 is formed by, for example, 1) insulative substrate preparing step, 2) first electrode forming step, 3) insulative body forming step, 4) lower-gap member forming step, 5) upper-gap member and second electrode forming step, and 6) sealing member forming step.

1) Insulative Substrate Preparing Step

The insulative substrate preparing step is to prepare the insulative substrate 10.

2) First Electrode Forming Step

The first electrode forming step is to form the first electrode 20 on the upper surface of the insulative substrate 10.

3) Insulative Body Forming Step

The insulative body forming step is to form the insulative body 30 such that it covers the first electrode 20, and to form the hole 30a in the insulative body 30 to expose a part of the upper surface of the first electrode 20.

4) Lower-Gap Member Forming Step

The lower-gap member forming step is to form the lower-gap member 51 in the inner wall of the hole 30a on the first electrode 20.

5) Upper-Gap Member and Second Electrode Forming Step

The upper-gap member and second electrode forming step is to form the upper-gap member 52 in the upper side of the inner wall of the hole 30a and to form the second electrode 40 on the upper surface of the insulative body 30. The upper-gap member 52 and the second electrode 40 may be formed simultaneously or separately.

6) Sealing Member Forming Step

The sealing member forming step is to form the sealing member 60 such that it covers the upper surface of the second electrode 40 and the opening of the hole 30a.

Here, a process of forming an interelectrode gap, which is to form the interelectrode gap 50 by forming the first electrode 20 and the second electrode 40 on the insulative substrate 10, corresponds to 1) insulative substrate preparing step, 2) first electrode forming step, 3) insulative body forming step, 4) lower-gap member forming step, and 5) upper-gap member and second electrode forming step. Further, a process of sealing, which is to seal the interelectrode gap 50 with the sealing member 60 while retaining the gap of the inter-gap electrode gap 50, corresponds to 6) sealing member forming step.

In addition, 7) electric field breaking step may be performed before or after 6) sealing member forming step.

The electric field breaking step is to assure the formation of the interelectrode gap 50. If the lower-gap member 51 and upper-gap member 52 shorts to each other, a variable resistance, a fixed resistance and a power source (all not shown) are connected in series to the first electrode 20 and second electrode 40. Then, resistance value of the variable resistance is regulated to decrease gradually, and application of voltage is stopped at the time current flow is lost. By this process, the interelectrode gap 50 is formed between the lower-gap member 51 and upper-gap member 52, and a nanogap electrode having a desired interelectrode distance G is obtained.

It is noted the above manufacturing method of the switching element 1 is one of examples, and the method does not limited thereto.

[Configuration of Memory Element Array]

The memory element array 100 of the present embodiment is, for example, a high density memory where switching elements 1 are disposed in array (two-dimensional array).

The memory element array 100 comprises, for example as shown in FIG. 2, switching elements 1, first electronic elements 200 connected to the switching elements 1, and second electronic elements 300 connected to the switching elements 1 and first electronic element 200.

The first electronic elements 200 and second electronic elements 300 may be any electronic elements, and do not specifically limited. For example, they may be p-n diodes or tunnel elements.

The electronic elements other than the switching element 1 provided with the memory element array 100 are not limited to these two of the first electronic elements 200 and second electronic elements 300, and the memory element array 100 may be provided with only single electronic element or three or more electronic elements. When the memory element array 100 is provided with a plurality of electronic elements other than the switching element 1, these electronic elements may be the same or different type.

Further, the memory element array 100 comprises at least the switching elements 1, and may or may not comprise other electronic elements.

In the memory element array 100 shown in FIG. 2, a first electrode 20 and a lower-gap member 51 of each switching element 1 are formed as separated parts respectively, and the first electronic element 200 and second electronic element 300 are disposed between the first electrode 20 and the lower-gap member 51.

That is, in a hole 30a, the first electronic element 200 is laminated in contact with the upper surface of the first electrode 20, and the second electronic element 300 is further laminated on the upper surface of the first electronic element 200. On an inner wall of the hole 30a, there are provided the lower-gap member 51 where one end thereof contacts the first electronic element 200 and the other end extends upward, and an upper-gap member 52 where one end thereof contact the second electrode 40 and the other end extends downward. The lower-gap member 51 and upper-gap member 52 define the interelectrode gap 50, and there are a gap in a nanometer order between the other end of the lower-gap member 51 and the other end of the upper-gap member 52.

[Manufacturing Method of Memory Element Array]

Next, a manufacturing method of the memory element array 100 is described.

The memory element array 100 is formed by, for example, 1) insulative substrate preparing step, 2) first electrode forming step, 3) insulative body forming step, 4) lower-gap member forming step, 5) upper-gap member and second electrode forming step, and 6) sealing member forming step.

1) Insulative Substrate Preparing Step

The insulative substrate preparing step is to prepare an insulative substrate 10.

2) First Electrode Forming Step

The first electrode forming step is to form a plurality of first electrodes 20 on the upper surface of the insulative substrate 10. The plurality of first electrodes 20 are disposed in parallel to each other.

3) Insulative Body Forming Step

The insulative body forming step is to form the insulative body 30 such that it covers the first electrodes 20, and to form a plurality of holes 30a in the insulative body 30 to expose a part of the upper surface of each first electrode 20.

4) Lower-Gap Member Forming Step

The lower-gap member forming step is to laminate electronic elements other than the switching elements 1 (for example, the first electronic elements 200 and second electronic elements 300) on the upper surface of the first electrodes 20 in the holes 30a, and to form lower-gap members 51 on the upper surfaces thereof.

Figure 3:
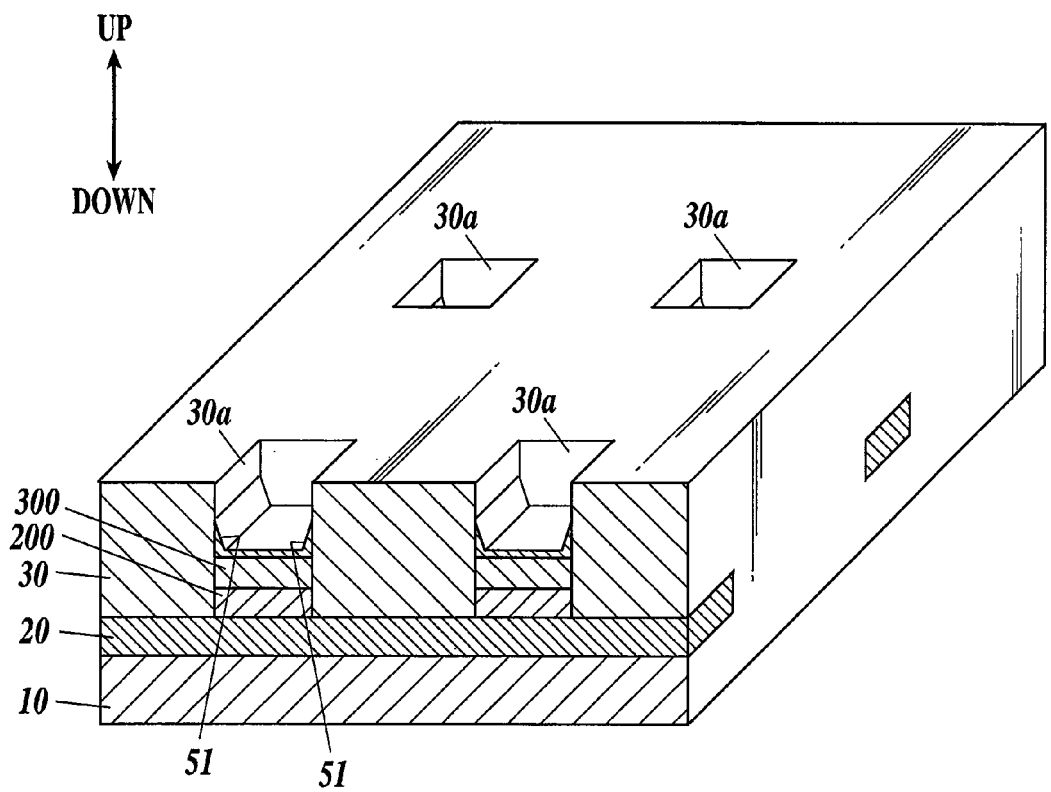
FIG. 3 is a sectional perspective view of the memory element array of the present embodiment in a course of manufacture when a lower-gap member forming step is completed.

For example, FIG. 3 is a sectional view schematically showing a main part of the switching elements 1 in a course of manufacture when the lower-gap member forming step is completed. In FIG. 3, the holes 30a are formed in a predetermined interval, and the first electronic element 200, second electronic element 300 and lower-gap member 51 are formed inside each of the holes 30a.

5) Upper-Gap Member and Second Electrode Forming Step

The upper-gap member and second electrode forming step is to form the upper-gap member 52 in the upper side of the inner wall of each of the hole 30a and to form a plurality of second electrodes 40 on the upper surface of the insulative body 30. The plurality of second electrodes 40 are disposed in parallel to each other, and in a direction perpendicular to the first electrodes 20.

6) Sealing Member Forming Step

The sealing member forming step is to form the sealing member 60 such that it covers the upper surfaces of the second electrodes 40 and the openings of the holes 30a.

Since the switching elements 1 are disposed at positions where holes 30a are formed, for example in FIG. 3, four switching elements 1 are disposed in the memory element array 100. The sealing member 60 seals each opening of the holes 30a, and thus it seals inter-electro gaps 50 of the switching elements 1 separately and independently to each other. This feature can solve the problem that all switching elements 1 arranged in the memory element array 100 break down when the sealing member 60 brakes. Therefore, it becomes possible to use the switching elements 1 effectively.

Needless to say, the number of the switching elements 1 disposed in the memory element array 100 is not limited to four and may be any plural number.

The sealing member 60 is not specifically limited in its shape as long as it can seal the interelectrode gaps 50 of the switching elements 1 one by one, and may be modified to any shape. Specifically for example, while the sealing member 60 seals only the upper surface of the second electrode 40 and the opening of the hole 30a in FIG. 1, it may be provided to cover the upper surface of the second electrode 40, the opening of the hole 30a and the upper surface of the insulative body 30.

As described above, the switching element 1 and the memory element array comprising the switching elements 1 of the present embodiment comprise the insulative body 30, the first electrode 20 and second electrode 40 provided to the insulative body 30, the interelectrode gap 50 between the first electrode 20 and second electrode 40 which has a gap in a nanometer order that causes switching phenomenon of resistance by applying a predetermined voltage between the first electrode 20 and second electrode 40, and the sealing member 60 which seals the interelectrode gap 50 such that the gap is retained.

The sealing member 60 is provided with respect to each switching element 1. Therefore, in the memory element array 100 where the switching elements 1 are disposed in array, such feature can solve the problem that all switching elements 1 arranged in the memory element array 100 break down when the sealing member 60 brakes. Therefore, it becomes possible to use the switching elements 1 effectively.

Since the interelectrode gap 50 is sealed, it can be kept under desired atmosphere.

Since the interelectrode gap 50 is sealed, the switching element 1 can be used under any atmosphere.

According to the switching element 1 and the memory element array 100 comprising the switching elements 1 of the present embodiment, since the sealing member 60 is made of insulative material, a plurality of switching elements 1 can be stacked up. Thus, it becomes possible to improve degree of integration.

According to the switching element 1 and the memory element array 100 comprising the switching elements 1 of the present embodiment, since the second electrode 40 is disposed above the first electrode 20, it becomes possible to improve degree of integration.

According to the switching element 1 and the memory element array 100 comprising the switching elements 1 of the present embodiment, the first electrode 20 is provided in contact with the upper surface of the insulative substrate 10, the switching element 1 comprises the insulative body 30 to cover the first electrode 20, the insulative body has a hole 30a to expose a part of the upper surface of the first electrode 20, the second electrode 40 is provided in contact with the upper surface of the insulative body 30, the interelectrode gap 50 is provided inside the hole 30a, and the sealing member 60 is provided to cover the upper surface of the second electrode 40 and the opening of the hole 30a.

Thus, the interelectrode gap 50 can be sealed with a simple configuration that the sealing member 60 covers the upper surface of the second electrode 40 and the opening of the hole 30a.

As described above, the method of manufacturing the switching element 1 (or ones provided in the memory element array 100) comprises the interelectrode gap forming step to form the interelectrode gap 50 by forming the first electrode 20 and second electrode 40 to the insulative substrate 10, and the sealing step to seal the interelectrode gap 50 with the sealing member 60 such that the gap of the interelectrode gap 50 is retained.

Since the sealing member 60 is formed separately from the first electrode 20 and second electrode 40, the sealing member 60 can be formed under any atmosphere, while the first electrode 20 and second electrode 40 is required to be formed in vacuum. Thus, it becomes possible to reduce a cost for a manufacturing device (coating device) of the sealing member 60.

Further, since the sealing member 60 is formed after the interelectrode gap 50 is formed, the interelectrode gap 50 may be placed under any desired atmosphere and sealed under the atmosphere. Thus, it becomes possible to keep the interelectrode gap 50 to be under the desired atmosphere.

The present invention is not limited to the above-described embodiments and may be modified within the spirit of the present invention.

The configuration of the switching element 1 and memory element array 100 and the structure of each component shown in the above embodiments are one of examples, and the present invention is not limited thereto.

For example, in the embodiments, the second electrode 40 is disposed above the first electrode 20, i.e. the first electrode 20 and second electrode 40 are arranged in a vertical direction. However, the first electrode 20 and second electrode 40 may be arranged in a horizontal direction. In this case, the lower-gap member 51 and upper-gap member 52, which are arranged in a vertical direction in the embodiments, may also be arranged in a horizontal direction.

The entire disclosure of Japanese Patent Application No. 2007-215864 filed on Aug. 22, 2007, including description, claims, drawings and summary are incorporated herein by reference in its entirety.

What is claimed is:

1. A switching element comprising:
   an insulative substrate;
   a first electrode and a second electrode provided to the insulative substrate;
   an interelectrode gap between the first electrode and the second electrode, comprising a gap of a nanometer order which causes switching phenomenon of resistance by applying a predetermined voltage between the first electrode and the second electrode; and
   a sealing member to seal the interelectrode gap such that the gap is retained.

2. The switching element according to claim 1, wherein the sealing member is made of insulative material.

3. The switching element according to claim 1, wherein the second electrode is disposed above the first electrode.

4. The switching element according to claim 3,
   wherein the first electrode is provided in contact with an upper surface of the insulative substrate,
   the switching element further comprises an insulative body to cover the first electrode,
   the insulative body includes a hole to expose a part of an upper surface of the first electrode,
   the second electrode is provided in contact with an upper surface of the insulative body,
   the interelectrode gap is provided inside the hole, and
   the sealing member covers an upper surface of the second electrode and an opening of the hole.

5. A method of manufacturing the switching element according to claim 1, comprising:
   an interelectrode gap forming step to form the first electrode and the second electrode to the insulative substrate, so as to form the interelectrode gap; and
   a sealing step, subsequent to the interelectrode gap forming step, to seal the interelectrode gap with the sealing member such that the gap of the interelectrode gap is retained.

6. A memory element array comprising a plurality of the switching elements according to claims 1 arranged in array as memory elements,
   wherein the interelectrode gaps of the switching elements are sealed with the sealing member separately and independently to each other.

7. A switching element comprising:
   an insulative substrate;
   a first electrode provided in contact with an upper surface of the insulative substrate;
   an insulative body provided to cover the first electrode, including a hole to expose a part of an upper surface of the first electrode;
   a second electrode provided in contact with an upper surface of the insulative body, located above the first electrode;
   an interelectrode gap between the first electrode and the second electrode in the hole, comprising a gap of a nanometer order which causes switching phenomenon of resistance by applying a predetermined voltage between the first electrode and the second electrode; and
   a sealing member to cover the second electrode and a opening of the hole, so as to seal the interelectrode gap such that the gap is retained, the sealing member being made of insulative material.

* * * * *